United States Patent [19]

Nagel

[11] 4,201,886
[45] May 6, 1980

[54] PLURAL CONCENTRIC MOVING COIL SPEAKER WITH PUSH-PULL VOLTAGE FOLLOWER DIRECT COUPLING

[75] Inventor: Martin J. Nagel, Russell Township, Geauga County, Ohio

[73] Assignee: Tenna Corporation, Cleveland, Ohio

[21] Appl. No.: 924,638

[22] Filed: Jul. 14, 1978

Related U.S. Application Data

[63] Continuation-in-part of Ser. No. 746,796, Dec. 2, 1976, Pat. No. 4,130,725.

[51] Int. Cl.$^2$ ............................................. H04R 3/00
[52] U.S. Cl. ........................... 179/1 A; 179/115.5 DV
[58] Field of Search ... 179/1 A, 115.5 DV, 115.5 VC

[56] References Cited

U.S. PATENT DOCUMENTS

| | | | |
|---|---|---|---|
| 2,164,374 | 7/1939 | Barker | 179/115.5 DV |
| 2,925,541 | 2/1960 | Koch | 179/115.5 VC |
| 2,959,640 | 11/1960 | Schultz | 179/1 A |
| 3,196,211 | 7/1965 | Kessenich | 179/115.5 DV |

FOREIGN PATENT DOCUMENTS

| | | | |
|---|---|---|---|
| 1047843 | 12/1958 | Fed. Rep. of Germany | 179/115.5 DV |
| 1083863 | 6/1960 | Fed. Rep. of Germany | 179/115.5 VC |
| 553225 | 12/1956 | Italy | 179/115.5 DV |

OTHER PUBLICATIONS

Proc. I. R. E., Jun. 1953, p. 719, FIG. 6, from "Symmetrical Properties of Transducers and Their Applications," Sziklai.

Primary Examiner—George G. Stellar
Attorney, Agent, or Firm—Watts, Hoffmann, Fisher & Heinke Co.

[57] ABSTRACT

A loudspeaker with an overlay voice coil and directly coupled push-pull audio amplifier circuit is disclosed. The overlay configuration compensates for increased input impedance at high frequencies by introducing a transformer coupling between two co-axial voice coils. The resultant input impedance remains fairly constant over a large frequency range, thereby insuring uniform power transfer to the speaker.

5 Claims, 5 Drawing Figures

PLURAL CONCENTRIC MOVING COIL SPEAKER WITH PUSH-PULL VOLTAGE FOLLOWER DIRECT COUPLING

CROSS REFERENCE TO RELATED APPLICATION

This application is a continuation-in-part of application Ser. No. 746,796 filed Dec. 2, 1976 entitled "Split-Coil Speaker with Direct Coupling", now U.S. Pat. No. 4,130,725.

BACKGROUND OF THE INVENTION

1. Field of the Invention

This invention relates to an improved speaker coil and directly coupled push-pull amplifier circuit for a speaker.

2. Prior Art

A typical speaker arrangement includes a cone or vibrating structure which when vibrating with the frequency of the sound to be produced causes the speaker to emit that sound. In an audio system, the sound to be produced is generated by an electrical signal typically of constant or substantially constant voltage, with frequency variations equal to the frequency variations of the sound. It is the function of the speaker to convert this electrical signal into mechanical vibrations and, hence, sound.

One technique for this conversion involves the sending of an electrical signal representation of the sound to be produced through a voice coil placed in a magnetic field. It is well known that when an electric charge moves in a magnetic field a force is exerted upon that charge. By applying an electrical signal, such as the amplified signal produced from a sound recording or radio receiver, to a coil of wire within a magnetic field, the coil can be moved at a frequency corresponding to the frequency variations in the applied electrical signal. Coil movement is transformed to sound through a cone or other vibrating structure of the speaker. One problem in speaker design is to achieve the conversion of electrical energy to sound in an efficient manner. Applicant's copending application now U.S. Pat. No. 4,130,725 discloses a split voice coil directly coupled to a push-pull type circuit to achieve efficient conversion. An earlier directly coupled split voice coil used with a push-pull circuit is disclosed in U.S. Pat. No. 2,959,640 issued to J. B. Schultz. Speaker coil circuits known within the art, however, are inefficient energy converters at high frequencies. The inefficiencies result from changes in the inductive reactance of the speaker coil with the driving frequency. At high signal frequencies the windings of a voice coil act as an inductor and therefore present a high impedance to those high frequency signals. As the load resistance or reactance increases with an increase in frequency, the power delivered to the speakers will decrease, since the input signal from the amplifier or driving circuit will remain constant.

SUMMARY OF THE INVENTION

The present invention provides a speaker of high fidelity output with an improved coil arrangement for increasing the efficiency with which the speaker is driven, over a broad frequency range. The speaker includes a cone, a magnet assembly defining a gap across which a magnetic flux extends to form a magnetic field, and two wire coils secured to the cone and movable axially in the gap. Each of the coils is wound in a helix, with the second coil wound coaxially with and over, i.e., about or around, the first coil to achieve effective transformer coupling between the two coils. Mechanical biasing means maintains the coils at a location within the extent of the useful magnetic field. It is intended that only one of the coils will be directly energized at a time. As the frequency of the driving signal increases, the coil arrangement creates a coupling effect that decreases load reactance to a degree that compensates for the typical increase in reactance at increased frequencies due to the inductive effect. The present invention also provides, in combination with such a speaker, a directly coupled push-pull amplifier circuit for driving the coils.

In a preferred embodiment, one or the other of the two coils is alternately energized as the signal from the amplifier circuit oscillates above and below a midpoint voltage. With one coil arranged about the other, the changing magnetic field produced by the coil that is energized induces a current within the non-energized coil. The resulting current in the two coils is acted upon by the magnetic field of the speaker magnet, which causes the speaker coils to move. The separately and alternately energized voice coils result in particularly efficient energy conversion at the high frequency range of speaker operation. The normally high increases in the coil impedance with higher frequencies are offset by compensating decreases in impedance due to the transformer coupling between the two coils. The coils act as two impedances connected in parallel rather than in series, and effectively halve the input impedance that the amplifier would otherwise be required to drive.

The overlay coil configuration has a further advantage. It is known within the art that the efficiency of a speaker is dependent upon the copper volume of the voice coil within the magnetic field. By winding one coil about the other, the effective volume of conductive material within the magnetic field is doubled at high frequencies due to the transformer coupling.

In a preferred arrangement, in which the speaker is used with a power amplifier, the coil is driven by a directly coupled, high-fidelity, push-pull circuit without signal or stabilizing feedback circuitry. Two transistor current amplifiers are coupled each to one layer of the speaker coil as followers without voltage gain, the gain of the circuit coming rather from the turns ratio of a transformer and being essentially independent of the transistor parameters. Good performance is achieved with few components, keeping costs relatively low.

The present invention finds particular use as a high power speaker and amplifier combination when connected to the output of a relatively low-power amplifier and energized through an external, low-voltage, single-ended, power source to increase the amplifier output. It is particularly useful with car radios, tape players, citizens band receivers and similar sound products, which operate from low-voltage, single-ended, power supplies, such as automotive batteries, and serves to greatly increase the volume while maintaining superior frequency response.

DESCRIPTION OF A PREFERRED EMBODIMENT

Figure 1:
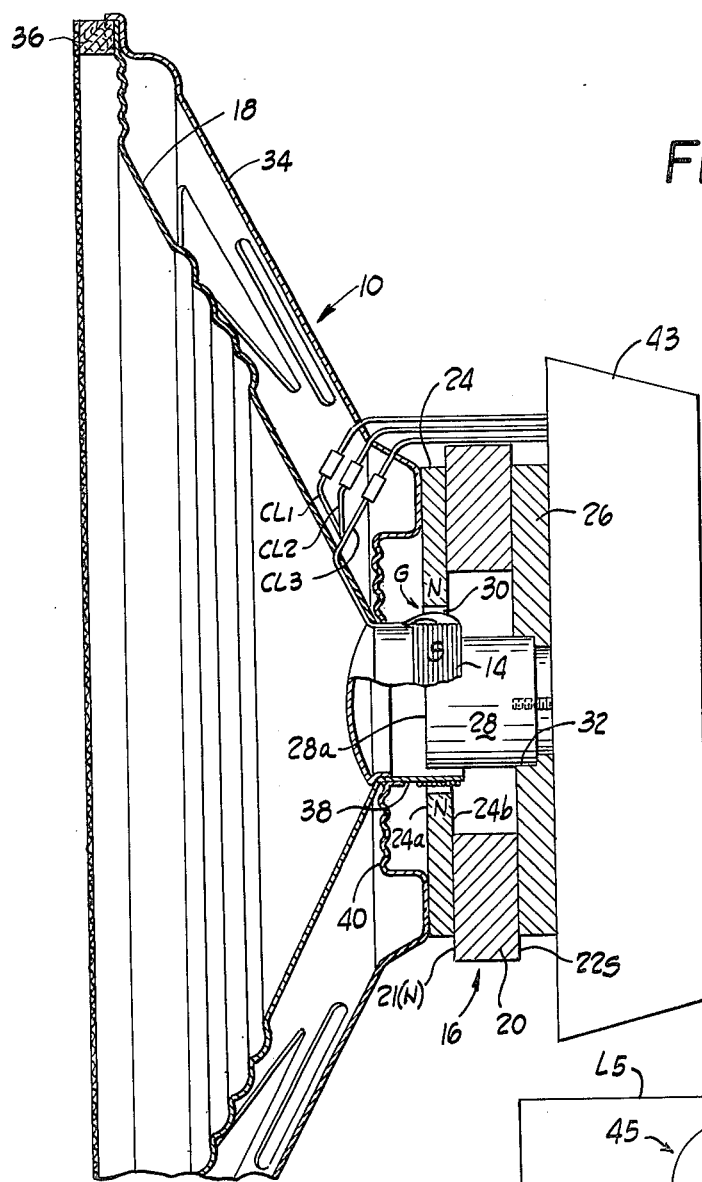
FIG. 1 is a sectional view, with parts in elevation, illustrating a loudspeaker with an overlay voice coil, constructed in accordance with the present invention.
Figure 2:
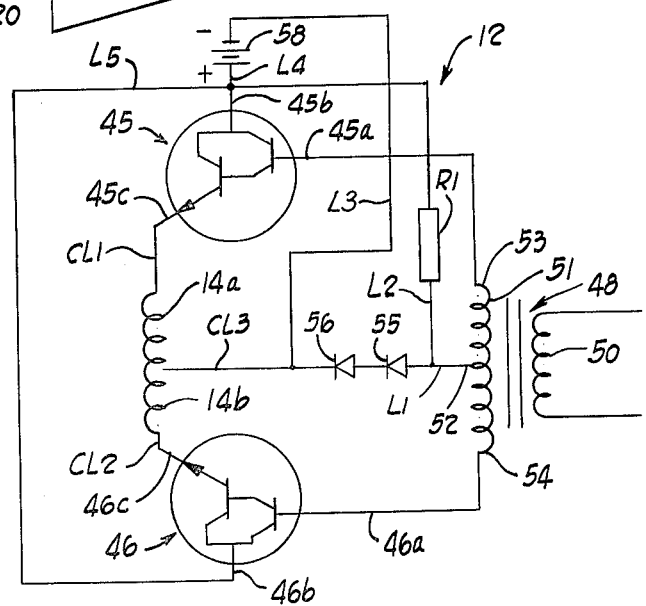
FIG. 2 is a schematic drawing of a preferred circuit for energizing the coil halves of the speaker coil shown in FIG. 1.

The present invention is embodied in an improved speaker 10 shown in FIGS. 1 and 3 of the drawings, and in the combination of the improved speaker 10 and a directly coupled amplifier circuit 12, shown in FIG. 2, in which current amplification is obtained from power supplied from an external source.

The speaker 10 utilizes an overlay driving coil 14 movable relative to a permanent magnet 16, to drive a cone 18. The overlay configuration results in uniform coil movement over a wide range of audio frequencies due to the transformer coupling between portions of the coil 14.

The permanent magnet assembly 16 is comprised of a magnetic annulus 20 with north and south pole faces 21, 22, respectively, soft iron front and back end plates 24, 26, and an iron core 28, which provide a magnetic circuit path. Both plates 24, 26 are annular. A central circular opening 30 in the front end plate 24 is slightly larger in diameter than the inside diameter of the coil and supporting form. One end 28a of the core 28 is essentially flush with the front surface 24a of the front end plate 24. The opposite end of the core 28 is received with an interference fit in a central aperture 32 of the end plate 26. This construction provides an annular gap G, with a depth equal to the thickness of the plate 24 and in which the coil 14 is located. The plate 24 forms a north magnetic pole about the outer periphery of the gap G and the core 28 forms a south magnetic pole, with the magnetic flux passing across the gap G along the entire length or depth.

The speaker 10 has a conventional rigid frame 34, for example, of sheet metal. The wide end or front of the cone 18 is secured at the front of the frame 34 and the permanent magnet assembly 16 is secured to the back of the frame 34. A mounting gasket 36 is secured to the cone at the front of the frame. A cylindrical coil form 38 is attached to the apex of the cone 18 and extends rearwardly into the permanent magnet assembly 16. A spider 40 is attached between the coil form 38 and the frame 34, locating the coil form within the annular gap G of the permanent magnet assembly and serving as a spring return, to urge the coil form in a direction along the axis of the form, back to the neutral position shown in FIGS. 1 and 3A, after an excursion.

Figure 3A:
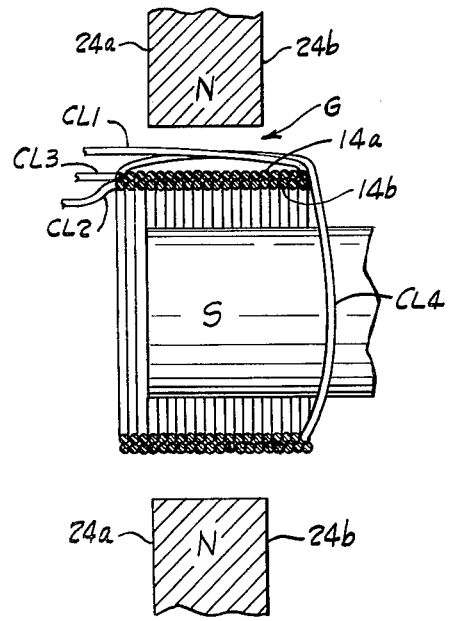
FIGS. 3A and 3B are enlarged sectional views of the speaker coil and speaker magnet of FIG. 1, diagrammatically illustrating the relationship between the speaker coil and the magnet when the coil is unenergized (FIG. 3A) and when one layer of the coil is energized (FIG. 3B)
Figure 3B:
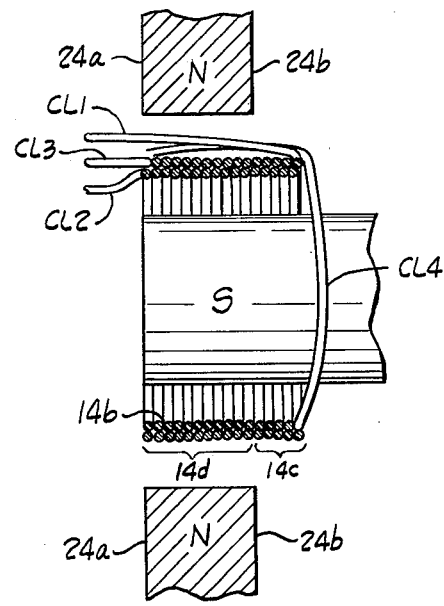

As best shown in FIG. 3A, the coil 14 includes two equal length layers or coils 14a, 14b wound in the same direction to form a concentric helical arrangement. Their length is greater than the thickness of the plate 24, which defines the depth of the gap G. When neither coil 14a, 14b is energized, both are located by the spider 40 within the gap so they extend equally beyond opposite sides of the plate 24. One end of the coil 14a and the opposite end of the coil 14b are connected to an energization circuit by a pair of electrical connections CL1, CL2. When energized the coils move due to the electromagnetic forces exerted on the coils by the magnetic field in the gap. The excursion of the coils during this movement brings one end of the coil closer to the gap and moves one end of the coil away from the gap. The length of the coil, however, is such that at maximum excursion the end moving toward the gap does not actually enter the gap. This design insures that the width of current carrying wire in the gap remains constant. The unenergized ends of the coils 14a, 14b are electrically joined by a connector CL4. This point of electrical connection between the two wires is connected to ground by means of a connector CL3 as shown in both FIG. 3A and FIG. 2.

While the overlay coils 14a, 14b have been shown in an embodiment where the length of the coils is greater than the gap G, the length of these coils 14a, 14b could be less than the gap length. In this alternate configuration the magnet endplate 24 would be wider than that shown while the length of the coils 14a, 14b would be shorter. In this configuration the movement of the shortened coils is of such an extent that the coil never emerges from the gap. At its maximum excursion the coil end approaches the edge of endplate 24 without passing it and therefore the coil at all times remains within the gap. This alternate arrangement as well as the embodiment described earlier therefore insure that the amount of magnetic flux interupted by current carrying wire is constant regardless of coil movement.

When the turns of either coil are energized by the energization or amplifier circuit, the resultant force on the wire will tend to move the coils 14a, 14b within the gap G, thereby moving the cone 18. The direction in which the turns are wound and the opposite direction of current flow through the turns of the two coils in operation are such that energization of coil 14a, moves the combined coil 14 in one direction and energization of coil 14b moves it in the opposite direction. Thus, with reference to FIGS. 3A and 3B, when coil 14b is energized, it moves from its equilibrium position shown in FIG. 3A to the position shown in FIG. 3B in which one end of the combined coil 14 is adjacent the front surface 24a of the endplate 24. At maximum excursion, a portion 14c of the coil 14 will be beyond the gap G and a second portion 14d will be totally within the gap G so that only a portion of the current is being significantly driven by the electromagnetic force provided by the magnet.

The overlay configuration of the coils results in transformer coupling between the two coils 14a, 14b. When one coil 14a, or 14b is energized, the electric current in that coil is not only affected by the permanent magnet plate 24, but also creates its own changing magnetic field. During the time period in which the current in the energized coil is increasing it induces a magnetic field which in turn induces a current in the non-energized coil.

The transformer coupling between the two coils 14a, 14b tends to reduce the input impedance at high frequencies. At low frequencies the current in the energized coil is not varying rapidly enough to produce significant magnetic induction effects. At the high frequencies, however, the transformer coupling produces an effect whereby the two coils 14a, 14b act as two resistances in parallel with a consequent halving of their input impedance.

Figure 4:
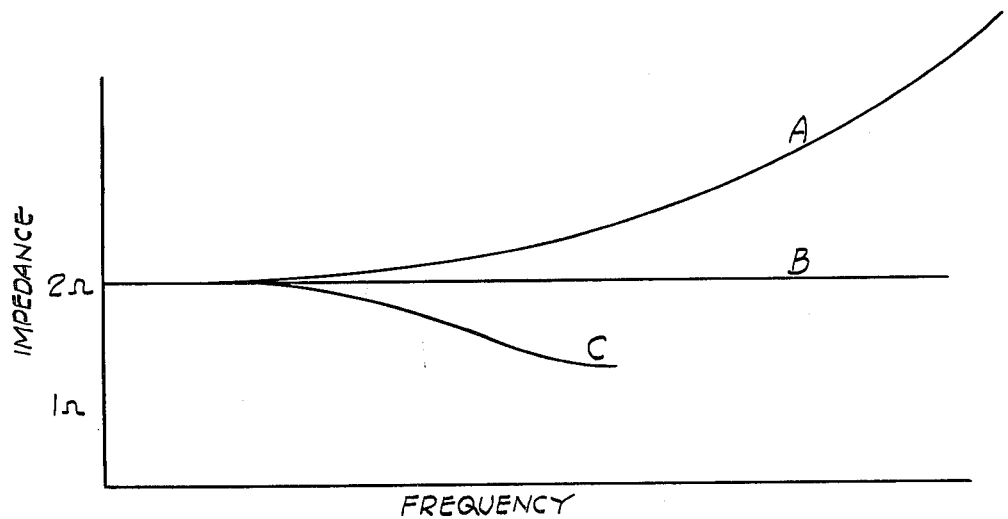
FIG. 4 is a graphical representation of the improved impedance characteristics of the overlay coil.

The resultant beneficial consequences of this overlay coil arrangement can qualitatively be understood with reference to the graph of FIG. 4, which represents a plot of effective input impedance of the combined coil 14 as it varies with driving frequency. At low frequencies the input impedance of the coil 14 is a relatively constant 2 ohms. (The low frequency impedance of any particular coil may vary from 2 ohms and that value is used by way of example only, to illustrate the typical performance of a coil embodying the present invention). As the frequency increases, three curves A, B, and C are shown.

Curve A represents a self inductive increase in the input impedance of a single coil without any coupling effect (e.g., nonoverlay construction). Without an overlay arrangement, this increase in coil impedance retards power transfer at high frequencies with an accompanying poor quality sound reproduction.

Curve C represents the decrease in input impedance of an overlay coil arrangement due to transformer coupling. At high frequencies the transformer effect of the two coils tends to decrease the impedance, until it approaches one half its original value. In the particular example illustrated the reduction in impedance reduces the impedance to one ohm.

Where transformer coupling is achieved with an overlay coil construction, the two effects depicted by the graph combine to produce an average value of input impedance represented by curve B. The combined overlay configuration therefore results in substantially uniform input impedance of the coil with more uniform power transfer from the amplifier circuit to the speaker cone 18 over a broad range of audio frequencies.

The overlay coil configuration produces an additional advantageous effect due to the doubling of conductive material within the magnetic gap G. At high frequencies the inductive transformer coupling produces two current flows in the coils 14a, 14b and the effective volume of coil within the gap is twice the volume for a single layer coil. It is known within the art that the efficiency of power transfer is proportional to the volume of the speaker coil. By doubling the effective coil volume while yet energizing only one of the coils 14a, 14b at a time, an increase in efficiency in addition to the decreased input impedance due to transformer coupling is achieved.

The overlay coil configuration shown is susceptible of certain design modifications. For example, the length of the overlay coil 14 may be shorter than the width of the magnetic gap G. Also, instead of using two separate wires wound on top of each other, an equally effective arrangement utilizes bifilar wire with appropriate ground connections hand wired to insure proper amplifier driving action. In a bifilar winding arrangement the separately energized coils form a double helix about a common axis. The separate wires typically lie next to each other instead of on top of each other. Like the overlay arrangement, the bifilar arrangement insures efficient transformer coupling between the two coils.

The amplifier circuit 12 shown diagrammatically in FIG. 2 is housed by a receptacle 43 carried by the magnet assembly 16. The circuit is a Class B push-pull circuit in which each layer 14a, 14b of the speaker coil 14 is directly coupled to a separate emitter-follower coupled current amplifier 45, 46. This circuit eliminates the need for an output transformer and requires no signal or stabilizing feedback circuitry.

The circuit 12 is comprised of an input transformer 48 with a primary coil 50 and a secondary coil 51 having a center tap 52. The primary coil 50 is connected to the signal output from a radio, tape player, or other amplifier (not shown). The secondary coil 51 is connected to one end 53 to the amplifier 45, and at its other end 54 to the amplifier 46. Both amplifiers 45, 46 as shown, are Darlington amplifiers, each having a base 45a, 46a, a collector 45b, 46b, and an emitter 45c, 46c. The coil end 53 is connected to the base 45a, and the coil end 54 is connected to the base 46a.

The center tap 52 of the secondary winding 51 is connected to ground or the negative terminal of a power source, such as a battery 58, through lines L1, L3 and through two diodes 55, 56, which produce a voltage drop essentially equal to the base-to-emitter drop of the two transistors that comprise each of the Darlington amplifiers 45, 46. The center tap 52 is also connected through a line L2 and a resistor R1, to a power source, such as the positive terminal of the battery 58. This circuit applies a forward bias to the bases 45a, 46a, through the secondary coil 51, so that the amplifiers 45, 46 will conduct immediately upon application of any signal voltage.

Coil lead CL1 from the outside coil 14a is connected to the emitter 45c of the amplifier 45, and the coil lead CL2 from the inside coil 14b is connected to the emitter 46c of the amplifier 46. A common or ground lead CL3 is connected to an end of the outside coil 14a opposite the end to which lead CL1 is connected. Lead CL3 is also connected to the inside coil 14b by means of a connecting lead CL4. Lead CL4 is connected to the inside coil at an end opposite the end to which CL2 is attached.

Each collector 45b, 46b of the amplifiers is connected to the power source 58, i.e., to the positive terminal of the battery in the embodiment shown, through lines L4 and L5.

In operation, in the absence of an input signal at the transformer primary 50, no output signal is produced in the coils 14a, 14b. A small bias current through lines CL1 and CL2 produces fields in coils 14a, 14b in a manner to cancel each other so no displacement of the coils results. Each half of the circuit, associated with one of the amplifiers 45, 46, conducts when a positive signal is applied to the amplifier through the secondary winding 51 of the input transformer 48. The current flow is amplified by the Darlington amplifiers 45, 46, each of which receives power from the external source 58.

When each amplifier 45, 46 conducts, one of the speaker coils 14a, 14b is energized, driving that coil due to the operation of the permanent magnet 16. At high frequencies, rapid energization/de-energization will also produce a transformer coupling between the coils so the current is induced in the non-energized coil. When the input current to the transformer 48 varies, it will cause current to flow in one of two directions through the secondary winding 51. When current flows to the base 45a, the amplifier 45 conducts and directly energizes the coupled coil 14a. At the same time, no current flows to the base 46a, because when the polarity at the end 53 of the coil 51 is positive with respect to the center tap 52, the polarity at the end 54 is negative. When the input signal is reversed, causing current to be applied to the base 46a, the amplifier 46 directly energizes the coupled coil 14b.

By way of a specific example, when the speaker 10 is used with an automobile radio to amplify the output of the radio for greater sound, the circuit 12 is connected to the automobile battery. Typically, the so-called 12 volt battery provides 14.4 volts DC and, as shown in FIG. 2, is connected to the collector electrodes 45b, 46b. A suitable transformer 48 for the circuit 12 has a turns ratio of 1:4 (primary to secondary coils). Considering each half of the secondary winding, the transformer will provide twice the input voltage to each amplifier 45, 46. The speaker coil 14 is constructed to provide a resistance of 2 ohms for each coil 14a, 14b as compared with the 8 ohm resistance of many typical speakers. As a result, the circuit 12 provides a theoretical power amplification increase of 16 times the input signal. In actual practice, an amplification of approximately ten to twelve times the input signal is achieved.

Also by way of example, 40 volt, 10 amp. silicon Darlington transistors are used as the amplifiers 45, 46, which provide current gain of 1,000 times or greater. The resistor R1 establishing the biasing current to the amplifiers is a one-half watt, 3900 ohm resistor.

A 6×9 inch speaker is suitable for automotive use and a preferred speaker utilizes a ring ceramic magnet with a soft iron core and a voice coil with a diameter of 1" wound on a suitable coil form. The width of the air gap G is suitably 0.050 inch and the length of the gap and thickness of the end plate 24 is suitably 0.25 inch. Each coil 14a, 14b extends beyond the gap G by approximately the maximum excursion of the coil and is therefore greater than 0.025 inch in length.

While a preferred embodiment of the present invention has been described in detail, it will be apparent that various modifications and alterations may be made therein without departing from the spirit and scope of the invention set forth in the claims. For example, it will be apparent that the various polarities, both electrical and magnetic, indicated in the circuit description can be reversed and the current amplifiers may be of different construction. For example, single transistors may be used in the place of Darlingtons, and vacuum tubes or field-effect transistors may be used in place of transistors or the like. Moreover, the benefits of the coil and speaker construction can be utilized with other than the preferred circuit.

What is claimed is:

1. In a power amplifier and transducer unit comprising a transducer, a magnet assembly defining a gap across which a magnetic flux extends to form a magnetic field, two wire coils secured to said transducer and movable axially in said gap, means biasing said coils to a location within the extent of the useful magnetic field and an amplifier circuit directly coupled to said coils for alternately electrically energizing said coils to move each when energized, the improvement wherein the amplifier circuit includes two voltage follower amplifiers directly coupled to two substantially identical helical coils concentrically wound to enhance high frequency transformer coupling which substantially reduces coil impedance by one-half and substantially doubles drive coil volume when one or the other of said coils is energized.

2. The apparatus of claim 1 wherein the coils are longer than the gap and of lengths to intercept constant volumes of magnetic flux within the gap as the coils travel from an equilibrium position.

3. A loudspeaker and amplifier of the push-pull class B type; said loudspeaker including a speaker cone, means defining an annular magnetic gap substantially narrower than its length and across which magnetic flux extends, two transformer coupled helical coils of wire within the gap secured to the speaker cone, axially aligned and forming concentric helixes, said coils having a length greater than the length of the gap, electrical leads attached to opposite ends of each coil for alternately electrically energizing the coils, and means locating said coils so their length extends on either side of the gap when neither coil is energized; and said amplifier including two emitter follower transistor amplifiers without feedback stabilization, one directly coupled to each coil to provide substantially balanced energization of said coils, and an input transformer coupled to a base of each of the transistor amplifiers; said coils and said circuit being so constructed and arranged that energization at high frequencies of either coil moves the energized coil in a direction along the length of the gap with a driving power essentially four times that of a single non-transformer coupled coil.

4. In a loudspeaker: a speaker cone; a permanent magnet assembly defining an annular gap across which magnetic flux extends; two substantially identical helical coils of wire within the gap, secured to the speaker cone, axially aligned and forming concentric helixes, said coils having a length greater than the length of the gap; means for electrically coupling an opposite end of each of the two coils directly to an amplifier circuit which includes two voltage follower transistor circuits without feedback stabilization for independent electrical energization of the coils; means for grounding the non-energized end of each of said coils to a common ground; and resilient means mechanically locating both coils within the gap when neither coil is energized.

5. The apparatus of claim 4 wherein the two coils comprise bi-filar windings concentrically wound; said windings including a first and second winding where one end of the first winding is electrically connected to an opposite end of the second winding and also connected to constant potential.

* * * * *